(12) United States Patent
Morales et al.

(10) Patent No.: US 6,680,263 B2
(45) Date of Patent: Jan. 20, 2004

(54) METHOD FOR APPLYING A PHOTORESIST LAYER TO A SUBSTRATE HAVING A PREEXISTING TOPOLOGY

(75) Inventors: Alfredo M. Morales, Livermore, CA (US); Marcela Gonzales, Seattle, WA (US)

(73) Assignee: Sandia National Laboratories, Livermore, CA (US)

( * ) Notice: Subject to any disclaimer, the term of this patent is extended or adjusted under 35 U.S.C. 154(b) by 206 days.

(21) Appl. No.: 10/074,195

(22) Filed: Feb. 12, 2002

(65) Prior Publication Data

US 2003/0152875 A1 Aug. 14, 2003

(51) Int. Cl.[7] .................... H01L 21/31; H01L 21/469
(52) U.S. Cl. .................................. 438/781; 438/780
(58) Field of Search ...................... 430/311, 312, 430/313, 314, 317, 322; 438/106, 119, 99, 694, 780, 781; 427/240, 346

(56) References Cited

U.S. PATENT DOCUMENTS

| | | | | |
|---|---|---|---|---|
| 4,290,384 A | * | 9/1981 | Ausschnitt et al. | 118/722 |
| 5,571,560 A | * | 11/1996 | Lin | 427/240 |
| 5,665,200 A | * | 9/1997 | Fujimoto et al. | 438/694 |
| 6,174,651 B1 | * | 1/2001 | Thakur | 430/327 |
| 2002/0004100 A1 | * | 1/2002 | Gurer et al. | 427/240 |
| 2002/0076660 A1 | * | 6/2002 | Toyota et al. | 430/330 |
| 2002/0098283 A1 | * | 7/2002 | Gurer et al. | 427/240 |
| 2002/0127334 A1 | * | 9/2002 | Gurer et al. | 427/240 |

* cited by examiner

Primary Examiner—Jack Chen
Assistant Examiner—William Vesperman
(74) Attorney, Agent, or Firm—Timothy P. Evans

(57) ABSTRACT

The present invention describes a method for preventing a photoresist layer from delaminating, peeling, away from the surface of a substrate that already contains an etched three dimensional structure such as a hole or a trench. The process comprises establishing a saturated vapor phase of the solvent media used to formulate the photoresist layer, above the surface of the coated substrate as the applied photoresist is heated in order to "cure" or drive off the retained solvent constituent within the layer. By controlling the rate and manner in which solvent is removed from the photoresist layer the layer is stabilized and kept from differentially shrinking and peeling away from the substrate.

10 Claims, 1 Drawing Sheet

METHOD FOR APPLYING A PHOTORESIST LAYER TO A SUBSTRATE HAVING A PREEXISTING TOPOLOGY

The United States Government has rights in this invention pursuant to Contract No. DE-AC04-94AL85000 between the United States Department of Energy and Sandia Corporation for the operation of Sandia National Laboratories.

BACKGROUND OF THE INVENTION

1. Field of the Invention

The present invention relates to a method of forming a fully adherent, planar photoresist coating film over a preexisting structure. More particularly, the present invention relates to a method for curing a liquid photoresist film such that excess solvent may be driven from the film without causing the film to de-bond and thereby peel from the coated substrate.

2. Description of Related Art

Spin coating is a widely used method to coat a resist solution uniformly over the wafer surface. In this technique, a semiconductor wafer is secured onto a spin chuck and rotated. While the semiconductor wafer is being rotated, a resist solution is supplied to the surface of the semiconductor wafer along its axis of rotation from a nozzle positioned above the wafer. The angular momentum of the spinning wafer forces the resist solution to spread out toward the circumference of the semiconductor wafer. Once sufficient amount of the resist solution is applied to cover the surface of the wafer the flow out of the nozzle is terminated and the semiconductor allowed to continue to rotate while gradually decreasing its rotational speed as the applied resist layer is allowed to dry.

By processing the wafer in this fashion it is also possible to apply a planar coating over the pre-existing surface topology, i.e., where the wafer surface has been patterned and etched. All techniques currently available that enable patterning over a pre-existing structure typically involve the application of a cover layer followed by a time consuming planarization process. The present invention avoids this requirement.

The current techniques also require removal of all or nearly all of the resist solvent component in order to obtain suitable lithographic patterning results, typically by baking the coated wafer at temperatures about or in excess of 100° C. However, if the coating covers a pre-existing surface structure the drying process is non-uniform and the resist layer tends to pull away or "peel," from the surface.

To overcome the problem of resist peeling, Shirakawa, et al., (U.S. Pat. No. 5,629,128) and others teach to add an adhesive aid. The applicant has found that by heating at a lower temperature (55° C.) for several hours a significant amount of the solvent component is driven off without causing the resist layer to peel, but enough solvent remains to cause poor lithographic image transfer during patterning resulting in a degraded pattern rendering.

SUMMARY OF THE INVENTION

Therefore, it is an object of the present invention to provide a process for applying a planar fully adherent, uniformly thick photoresist layer onto a wafer surface having a pre-existing structure or topology.

Another object of this invention is to provide a method for applying a planar layer of photoresist to a pre-existing surface structure and which will not peel away from that structure.

It is another object to provide a method for minimizing patterning distortion in a photoresist layer that is applied over an existing surface structure and that is subsequently lithographically imaged and developed.

Yet another object of this invention to provide a method for patterning features within a microchannel trench, such as in a microfluidic channel.

The foregoing objects are meant as illustrative of the invention only and not as an exhaustive list. These and other objects will become apparent to those having ordinary skill in these arts as the invention is described in detail.

These and other objects of the invention will be apparent to those skilled in the art based on the teachings herein. The present invention is a condensation method for applying and maintaining a thin layer of liquid solvent on the surface of an applied photoresist layer and thereby exceed the evaporation pressure of the solvent within the resist layer and slowing the loss of solvent from that layer. By controlling the rate at which solvent evaporates from the resist layer it has been found that tendency of the applied resist layer to peel away from the surface structure of the wafer to be minimized or eliminated altogether.

DETAILED DESCRIPTION OF THE INVENTION

Figure 1:
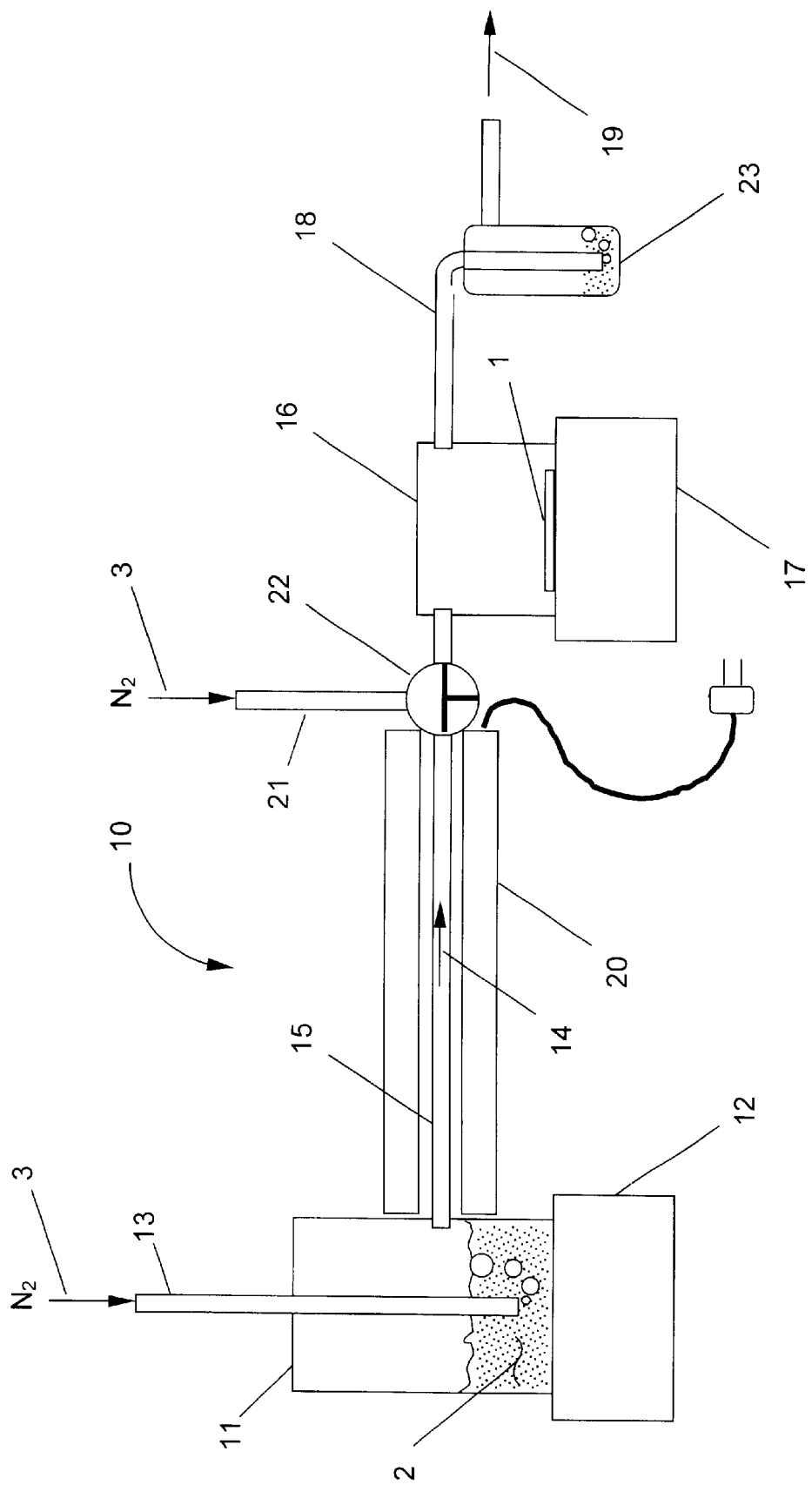
FIG. 1 shows a schematic of the disclosed wafer process system.

The present invention provides a process for applying a planar photoresist coating onto a substrate having a pre-existing surface structure. In particular, where a silicon wafer has been lithographically patterned and etched to provide surface structures and where further lithographic processing is desired over, on, or in those structures, the application of a photoresist layer over the pre-existing structure will typically be non-planar that lead to distortion in the patterning process. In addition, as the solvent component of the photoresist is removed, usually by heating the substrate to accelerate solvent evaporation, the resist layer may shrink and peel away from the substrate surface. Attempting to mitigate this delamination by heating the resist at a lower temperature results a sufficient solvent remaining after 8–16 hours of heating to cause poor lithographic imaging when the part is patterned.

The instant invention provides a condensation process for maintaining a high partial pressure of the solvent component over the coated substrate in order to control the rate of evaporation of the solvent from the applied resist layer as it is heated.

As required, a detailed description of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

The invention is best described with reference to FIG. 1.

Disclosed is a method wherein a first sealed reactor containing a quantity of the liquid solvent used to formulate the photoresist is connected to a second sealed container containing the a photoresist coated substrate. The reactor containing the liquid solvent is heated to a temperature that provides for a substantial partial pressure of the solvent vapor but remains well below the boiling point of the liquid. Dry nitrogen gas is bubbled through the liquid solvent such that it becomes saturated with the solvent vapor. The saturated nitrogen gas is then directed to the substrate chamber through a heated conduit where it passes over the resist coated substrate. The solvent vapor in the atmosphere of the second container establishes a condensation equilibria at the surface of the resist layer which is also heated. The established equilibria allows the temperature of the substrate to be increase to a point where the solvent content of the uncured resist layer can be driven off rapidly without fear of delaminating the resist layer from the underlying substrate structure.

Specific Embodiment

In order to test the process, a 4 inch diameter silicon wafer 1 was patterned and etch with a plurality of dovetailed features (not shown). Wafer 1 was then coated with SJR 5740 Novolak (manufactured by the Shipley Co., Inc.) photoresist by dispensing the liquid resist onto the wafer for 10 seconds as the wafer was spun at 1200 rpm. This process was repeated three times in order to obtain the desired coating thickness. Greater or fewer repetitions are possible depending upon the resist viscosity and composition.

The wafer resist coating was allowed to dry over night at room temperature and it is then prepared for processing by placing it into saturation container 16. Before heating the wafer to remove the excess solvent in the resist layer, a quantity of propylene glycol monomethyl ether acetate ("PGMEA") solvent 2 is placed into reactor chamber 11 and dry nitrogen gas 3, conducted into reactor container 11 through conduit 13, is bubbled through the liquid solvent 2. Solvent-saturated nitrogen gas 14 is then conducted into saturation container 16 through conduit 15 (heated by heat jacket 20 to prevent premature condensation) where it encounters the resist coated wafer 1.

Excess gas 19 is exhausted from process system 10 through a third conduit 18 and out into the ambient atmosphere where it is be vented through an exhaust hood (not shown). Optionally, bubbler 23 may be used to isolate the atmosphere in container 16 to prevent backflow of ambient air.

As dry nitrogen gas 3 initially flows through process system 10 the quantity of PGMEA solvent 2 is heated by hot plate 12 to a temperature between about 110° C. and 110° C. (about 75% to 80% of the solvent boiling point of 146° C.). As solvent 2 heats its vapor pressure increases and the dry nitrogen 3 carries some fraction of the solvent vapor into saturation container 16 where a thin layer of the solvent is observed to condense on top of the resist layer. After several minutes of heating, the liquid solvent 2 is also observed condensing at the exit end of conduit 18.

Simultaneously with the heating of liquid solvent 2, resist-coated wafer 1 is heated by hot plate 17 until a thermocouple (not shown), or similar heat probe located just directly beneath wafer 1, registers a temperature of about 110° C. This temperature is chosen to insure that the kinetics of the solvent evaporation from the photoresist layer are rapid enough to remove most of the remaining solvent content in the photoresist layer within about 15 minutes. (In any case, it is necessary to reduce the solvent content to a point where it will not interfere with lithographic imaging in the layer.)

The temperature of the resist-coated wafer 1 is held constant for about 5 minutes in the solvent saturated atmosphere after which the solvent source is removed by rotating three-way valve 22 counter-clockwise so as to close off gas flow from conduit 15 and to open conduit 21 to pure nitrogen gas flow. The flow of nitrogen gas through conduit 21 and the temperature of the wafer (~110° C.) are maintained constant for about another 15 minutes after which hot plate 17 is turned off and wafer 1 allowed to cool to room temperature. Once the wafer has cooled to near room temperature it can be removed and processed further (i.e., lithographically imaged and etched).

By following the above protocol it is possible to prevent the resist coating laid down over the pre-existing surface structure from peeling away from that surface as the resist is heated to remove the solvent component and thus render it ready for further lithographic patterning.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. A method for preventing a photoresist layer from peeling off a substrate surface having a preexisting structure, comprising the step of:

providing a substrate surface having a 3-dimensional structure covering at least portion of said surface;

coating said substrate surface with a liquid photoresist thereby providing a coated substrate, said photoresist comprising a solvent component;

partially drying said liquid photoresist to provide an uncured photoresist layer, wherein said uncured photoresist layer retains at least a portion of said solvent component;

establishing a first atmosphere above said coated substrate wherein said first atmosphere comprises a carrier gas saturated with a vapor phase of said solvent component, and wherein some of said solvent component vapor phase condenses onto said uncured photoresist layer;

heating said coated substrate to a first temperature chosen to cause said solvent portion of said uncured photoresist layer to evaporate at a rate which would remove all or nearly all of said solvent portion from said uncured photoresist layer within about 15 minutes;

maintaining said first temperature and first atmosphere for about 5 minutes;

displacing said first atmosphere with a second atmosphere comprising only said carrier gas maintaining said first temperature for about an additional 15 minutes; and cooling said coated substrate to a second temperature equal to about room temperature while maintaining said second atmosphere, to provide a fully adherent photoresist layer coating said substrate surface.

2. The method of claim 1, wherein said step of coating comprises coating said substrate surface with one or more layers of said liquid photoresist.

3. The method of claim 1, wherein said step of establishing a first atmosphere further comprises:

providing a quantity of said solvent;

heating said solvent to a temperature about equal to 75% to 80% of said solvent boiling point and causing some of said solvent to evaporate into a space above said solvent;

bubbling said carrier gas through said quantity of said solvent, wherein said carrier gas is saturated with said solvent; and containing and directing said solvent saturated carrier gas into a space over said coated substrate such that said solvent saturated carrier gas forms an atmosphere above said coated substrate at a pressure of about 1 Bar.

4. The method of claim 3, wherein said quantity of solvent and said coated substrate are held in first and second closed containers respectively, wherein said first and second containers are connected by means of an open conduit such that each container shares a common atmosphere.

5. The method of claim 4, wherein said open conduit is heated.

6. The method of claim 4, wherein said step of displacing said first atmosphere further comprises a valve means for closing said open conduit to said second closed container while simultaneously opening said conduit to a source of only said carrier gas, wherein said carrier gas directed into said space over said coated substrate such that said carrier gas forms an atmosphere above said coated substrate at a pressure of about 1 Bar.

7. The method of claim 3, wherein said carrier gas is a dry inert gas.

8. The method of claim 7, wherein said carrier gas either nitrogen gas or argon gas.

9. The method of claim 3, wherein said liquid solvent comprises propylene glycol monomethyl ethyl acetate.

10. The method of claim 1, wherein said first temperature is between about 110° C. to 120° C.

* * * * *